(12) United States Patent
You

(10) Patent No.: US 9,036,832 B2
(45) Date of Patent: May 19, 2015

(54) AUDIO SIGNAL ADJUSTMENT FOR TWO SIGNALS TO BE PLAYED AT THE SAME TIME

(75) Inventor: Qiang You, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 255 days.

(21) Appl. No.: 13/572,682

(22) Filed: Aug. 12, 2012

(65) Prior Publication Data

US 2013/0315420 A1 Nov. 28, 2013

(51) Int. Cl.
- *H03G 3/00* (2006.01)
- *G11B 20/10* (2006.01)
- *G10L 25/00* (2013.01)

(52) U.S. Cl.
CPC .............. *G11B 20/10* (2013.01); *G10L 25/00* (2013.01)

(58) Field of Classification Search
CPC ................................... H03G 5/02; H03G 5/16
USPC ...................... 381/104, 107, 109, 80–81, 123
See application file for complete search history.

(56) References Cited

U.S. PATENT DOCUMENTS

2006/0013414 A1* 1/2006 Shih .............................. 381/107
2006/0262529 A1* 11/2006 Hornsby et al. .............. 362/231

OTHER PUBLICATIONS

Skype Support, What happens when someone calls me while I'm on a call in Skype for Mac OS X?, Jan. 27, 2011.*
Skype Support, "What happens when someone callms me while I'm on a call in Skype for MacOS X?", Jan. 27, 2011.*

* cited by examiner

*Primary Examiner* — Ahmad F Matar
*Assistant Examiner* — Katherine Faley
(74) *Attorney, Agent, or Firm* — Novak Druce Connolly Bove + Quigg LLP

(57) ABSTRACT

A computerized method adjusts two presented audio signals using an audio player. A first audio signal is received and played through an audio playing unit. When a second audio signal that is inserted to be played is received in time during the playing of the first audio signal, a peak amplitude X of a volume of the first audio signal and a peak amplitude Y of a volume of the second audio signal are extracted. Each of the peak amplitude X and the peak amplitude Y are compared with a predetermined threshold value A. The first audio signal and/or the second audio signal are adjusted according to the comparison, and the first audio signal and/or the second audio signal is outputted to the audio playing unit and played through the audio playing unit according to the adjustment for the first audio signal and/or the second audio signal.

16 Claims, 3 Drawing Sheets

AUDIO SIGNAL ADJUSTMENT FOR TWO SIGNALS TO BE PLAYED AT THE SAME TIME

BACKGROUND

1. Technical Field

Embodiments of the present disclosure relate to audio processing technologies, and particularly to an audio signal adjustment method and an audio player having an audio signal adjustment function.

2. Description of Related Art

Many audio players, such as smart phones, mobile internet devices, and tablet personal computers support to simultaneously play multiple audio signals. However, users may have bad experiences if an unwanted audio signal (e.g., an advertisement having an audio signal) is inserted when they are enjoying music, film, or other similar audio entertainments. Further, the users may feel uncomfortable if the inserted audio signal has an unacceptable high volume, which may even be harmful to listening of the users. Therefore, there is a room for improvement in the art.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean "at least one".

Figure 1:
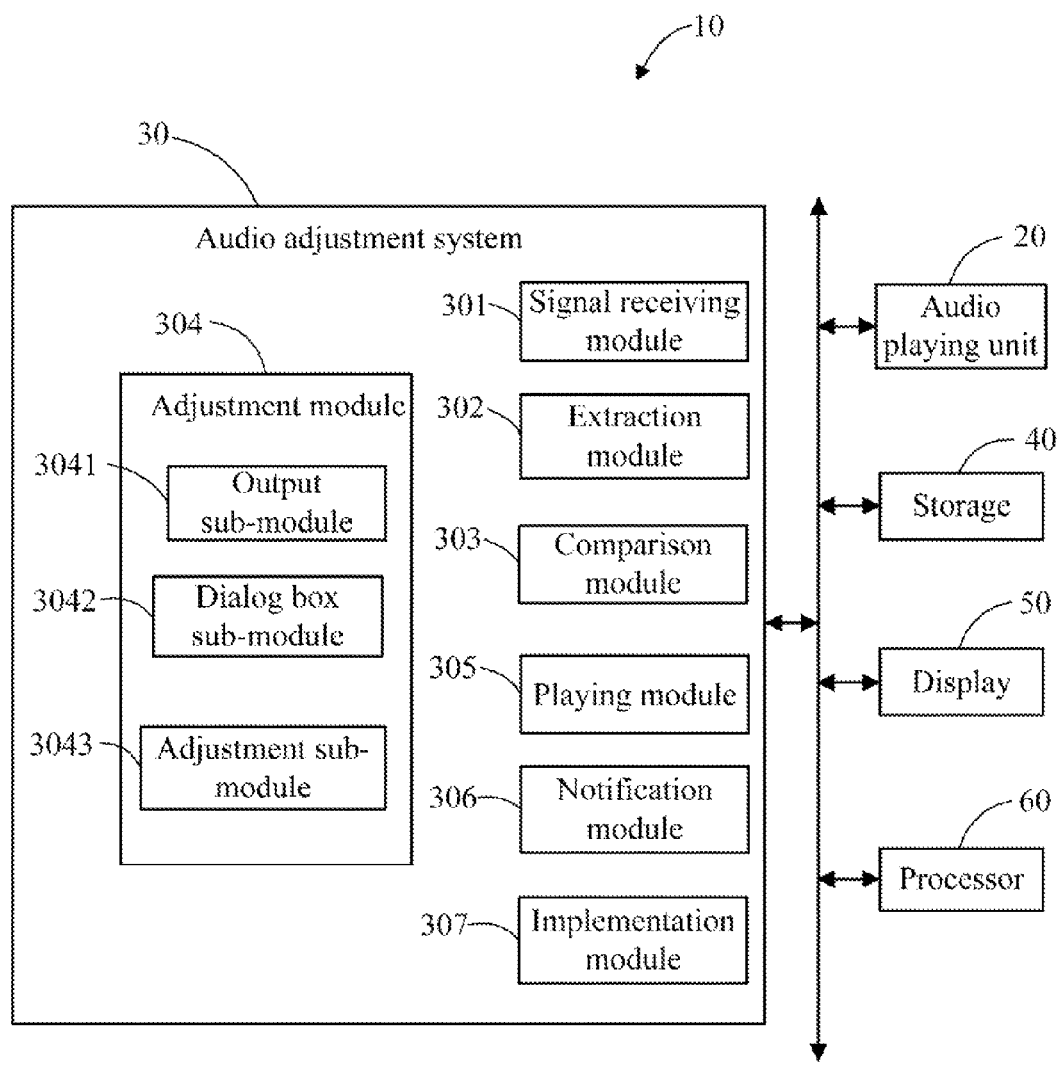
FIG. 1 is a schematic block diagram illustrating one embodiment of an audio player.

FIG. 1 is a schematic block diagram illustrating one embodiment of an audio player 10. The audio player 10 includes an audio playing unit 20, an audio adjustment system 30, a storage 40, a display 50, and a processor 60. In the embodiment, the audio player 10 may be, for example, a smart phone, a mobile internet device, a desktop computer, a portable computer, or other similar devices that can play different kinds of audio signals. FIG. 1 shows one example of the audio player 10, and the audio player 10 can include more or fewer components than those shown in the embodiment, or have a different configuration of the components.

The audio adjustment system 30 may include a plurality of software programs in the form of one or more computerized instructions stored in the storage 40 and executed by the processor 60 to perform operations of the audio player 10. The software programs of the audio adjustment system 30 may be embedded in a device driver, such as a driver of a sound card, of the audio player 10. In the embodiment, the audio adjustment system 30 includes a signal receiving module 301, an extraction module 302, a comparison module 303, an adjustment module 304, and a playing module 305. In general, the word "module", as used herein, refers to logic embodied in hardware or firmware, or to a collection of software instructions, written in a programming language, such as, Java, C, or assembly. One or more software instructions in the modules may be embedded in firmware, such as in an erasable programmable read only memory (EPROM). The modules described herein may be implemented as either software and/or hardware modules and may be stored in any type of non-transitory computer-readable medium or other storage device. Some non-limiting examples of non-transitory computer-readable medium include CDs, DVDs, BLU-RAY, flash memory, and hard disk drives.

In the embodiment, the audio player 10 supports simultaneous play of at least two audio signals. An audio signal that is first played by the audio player 10 is defined as a first audio signal. Another audio signal that is inserted and is to be played later during the playing of the first audio signal is defined as a second audio signal.

The signal receiving module 301 receives the first audio signal, and plays the first audio signal by outputting the first audio signal to the audio playing unit 20. In the embodiment, the first audio signal may be received from any activated audio file, such as music or a video, which is stored in the storage 40 or presented on the Internet. The signal receiving module 301 further receives the second audio signal that is inserted during the playing of the first audio signal.

The extraction module 302 extracts a peak amplitude X of the first audio signal, and a peak amplitude Y of the second audio signal when the second audio signal is received. The peak amplitude refers to a maximum absolute value of audio signals in audio system measurements.

The comparison module 303 compares each of the peak amplitude X and peak amplitude Y with a threshold value A. In the embodiment, the threshold value A is predetermined by a user of the audio player 10, which indicates a maximum volume of an audio signal acceptable by the user. In other embodiments, the threshold value A may be a system default value to protect listening of the user.

The adjustment module 304 adjusts the first audio signal and/or the second audio signal according to the comparison of each of the peak amplitude X and peak amplitude Y with the threshold value A. In the embodiment, the adjustment module 304 includes an output sub-module 3041, a dialog box sub-module 3042, and an adjustment sub-module 3043. If both the peak amplitude X and the peak amplitude Y are not greater than the threshold value A (X<A, and Y<A), the output sub-module directly outputs the second audio signal to the audio playing unit 20 to play the second audio signal as well as the first audio signal. If any of the peak amplitude X and the peak amplitude Y is greater than the threshold value A, the dialog box sub-module 3042 displays a dialog box that includes a list of options on the display 50, and notifies the user to select one of the options to adjust the first audio signal and/or the second audio signal. The adjustment sub-module 3043 adjusts the first audio signal and/or the second audio signal according to the option selected by the user. In the embodiment, the options include one or more manners for adjusting the first audio signal and/or the second audio signal.

Figure 2:
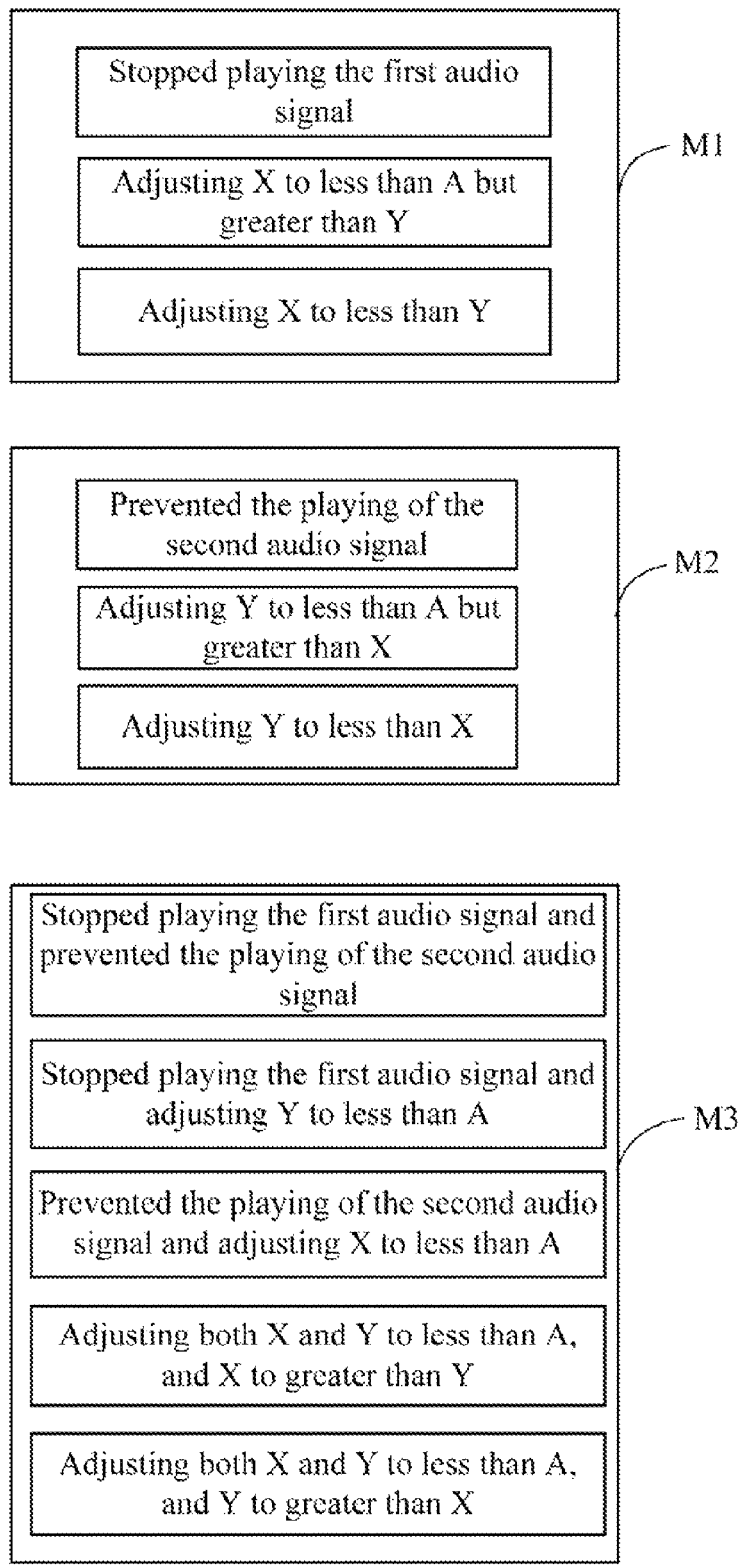
FIG. 2 illustrates a schematic diagram of dialog boxes displayed on the audio player.

In one example, as shown in FIG. 2, if X>A, and Y≤A, a first dialog box M1 is displayed. The first dialog box M1 includes options "Stopping playing the first audio signal", "Adjusting X to less than A but greater than Y", and "Adjusting X to less than Y". If Y>A, and X≤A, a second dialog box M2 is displayed. The second dialog box M2 includes options "Preventing the playing of the second audio signal", "Adjusting Y to less than A but greater than X", and "Adjusting Y to less than X". If X>A and Y>A, a third dialog box M3 is displayed. The third dialog box M3 includes options "Stopping playing the first audio signal and preventing the playing of the second audio signal", "Stopping playing the first audio signal and adjusting Y to less than A", "Preventing the playing of the second audio signal and adjusting X to less than A", "Adjusting both X and Y to less than A, and X to greater than Y", and "Adjusting both X and Y to less than A, and Y to greater than X".

The playing module 305 outputs the first audio signal and/or the second audio signal to the audio playing unit 20 according to the adjustment for the first audio signal and/or the second audio signal, and plays the outputted first audio signal and/or the second audio signal through the audio playing unit 20.

In another embodiment, the audio adjustment system 30 further includes a notification module 306 and an implementation module 307. The notification module 306 notifies the user to determine whether to play the second audio signal through a user interface when the second audio is inserted to be played. The implementation module 307 directly outputs the second audio signal to the audio playing unit 20 if the user agrees to play the inserted second audio signal, or prevents the playing of the second audio signal if the user disagrees to the playing of the inserted second audio signal.

Figure 3:
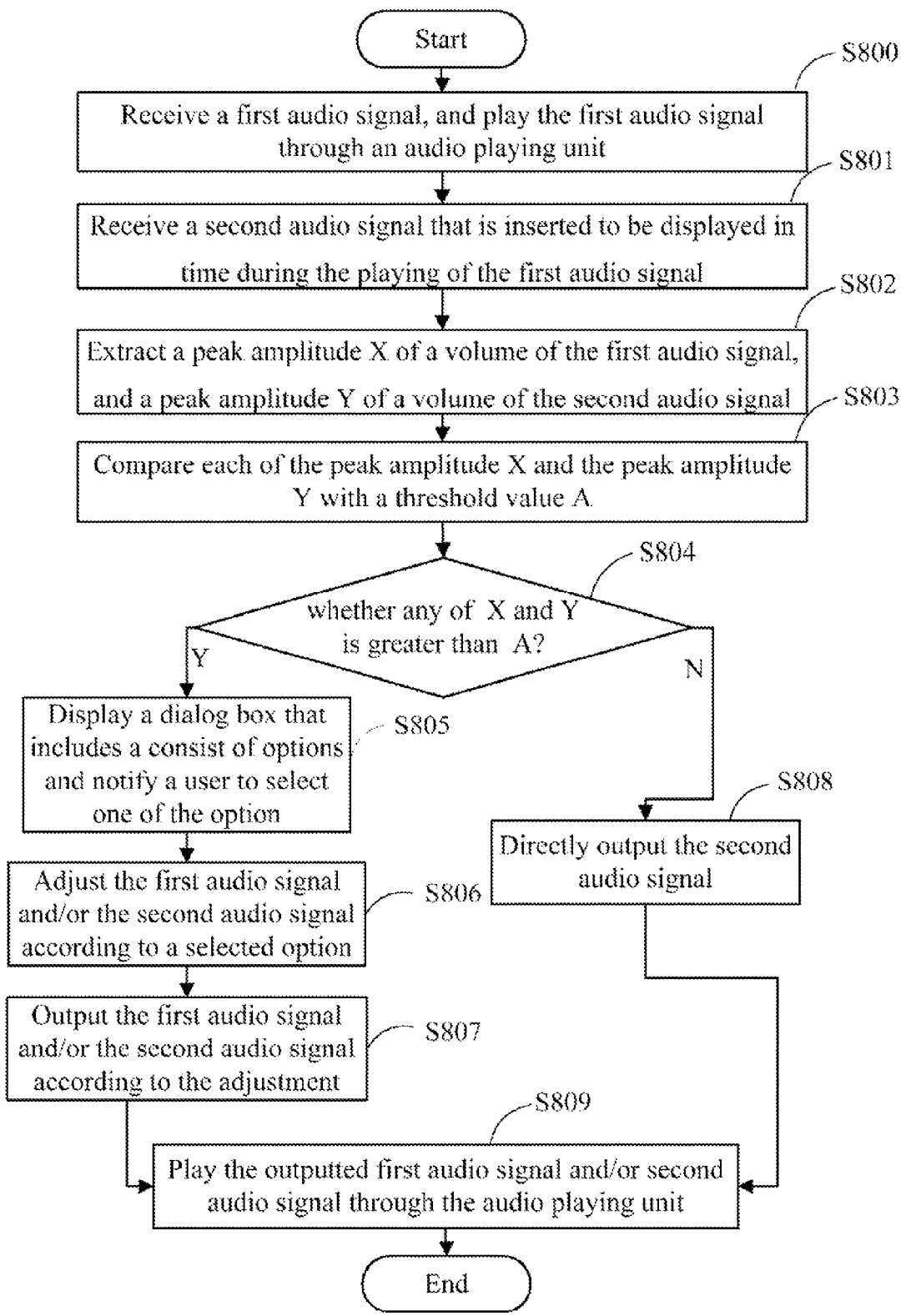
FIG. 3 is a flowchart of one embodiment of an audio signal adjustment method implemented by the audio player of FIG. 1.

FIG. 3 is a flowchart of one embodiment of an audio signal adjustment method implemented by audio player 10 of FIG. 1. Depending on the embodiment, additional steps may be added, others removed, and the ordering of the steps may be changed.

In step S800, the signal receiving module 301 receives a first audio signal, and plays the first audio signal by outputting the first audio signal to the audio playing unit 20. In the embodiment, the first audio signal may be received from any activated audio file, such as music or a video, which is stored in the storage 40 or presented on the Internet.

In step S801, the signal receiving module 301 receives a second audio signal that is inserted to be played later during the playing of the first audio signal.

In step S802, the extraction module 302 extracts a peak amplitude X of the first audio signal, and a peak amplitude Y of the second audio signal.

In step S803, the comparison module 303 compares each of the peak amplitude X and the peak amplitude Y with a threshold value A. In the embodiment, the threshold value A is predetermined by a user of the audio player 10, which indicates a maximum volume of an audio signal acceptable by the user. In other embodiments, the threshold value A may be a system default value to protect listening of the user.

In step S804, the comparison module 303 determines whether any of the peak amplitude X and the peak amplitude Y is greater than the threshold value A. If at least one of the peak amplitude X and the peak amplitude Y is greater than the threshold value A, step S805 is implemented. Otherwise, if both the peak amplitude X and the peak amplitude Y are not greater than the threshold value A, block S808 is implemented.

In step S805, the dialog box sub-module 3042 displays a dialog box that includes a list of options on the display 50, and notifies a user to select one of the options to adjust the first audio signal and/or the second audio signal.

In step S806, the adjustment sub-module 3043 adjusts the first audio signal and/or the second audio signal according to the option selected by the user. In the embodiment, the options include one or more manners for adjusting the first audio signal and/or the second audio signal.

In step S807, the playing module 305 outputs the first audio signal and/or the second audio signal to the audio playing unit 20 according to the adjustment for the first audio signal and/or the second audio signal, procedure goes to step S809.

In step S808, the output sub-module 3041 directly outputs the second audio signal to the audio playing unit 20.

In step S809, the audio playing unit 20 plays the outputted first audio signal and/or the second audio signal.

Although certain embodiments of the present disclosure have been specifically described, the present disclosure is not to be construed as being limited thereto. Various changes or modifications may be made to the present disclosure without departing from the scope and spirit of the present disclosure.

What is claimed is:

1. A computerized audio signal adjustment method using an audio player, the method comprising:
   receiving a first audio signal, and playing the first audio signal by outputting the first audio signal to an audio playing unit of the audio player;
   receiving a second audio signal that is inserted to be played later during the playing of the first audio signal;
   extracting a peak amplitude X of the first audio signal, and a peak amplitude Y of the second audio signal before the second audio signal is outputted;
   comparing each of the peak amplitude X and the peak amplitude Y with a predetermined threshold value A;
   adjusting the first audio signal and/or the second audio signal according to the comparison of each of the peak amplitude X and peak amplitude Y with the threshold value A when at least one of the peak amplitude X and the peak amplitude Y is greater than the threshold value A;
   outputting the first audio signal and/or the second audio signal to the audio playing unit according to the adjustment for the first audio signal and/or the second audio signal;
   and playing the outputted first audio signal and/or the second audio signal through the audio playing unit.

2. The method according to claim 1, wherein adjusting the first audio signal and/or the second audio signal comprises:
   displaying a dialog box on a display of the audio player that includes options indicating manners for adjusting the first audio signal and/or the second audio signal, and notifying a user to select one of the options to adjust the first audio signal and/or the second audio signal, when at least one of the peak amplitude X and the peak amplitude Y is greater than the threshold value A; and
   adjusting the first audio signal and/or the second audio signal according to the option selected by the user.

3. The method according to claim 2, wherein the options include one or more manners for adjusting the first audio signal and/or the second audio signal.

4. The method according to claim 2, wherein the dialog box includes options: "Stopping playing the first audio signal", "Adjusting X to less than A but greater than Y", and "Adjusting X to less than Y", when the peak amplitude X is greater than the threshold value A and the peak amplitude Y is not greater than the threshold value A.

5. The method according to claim 2, wherein the dialog box includes options: "Preventing the playing of the second audio signal", "Adjusting Y to less than A but greater than X", and "Adjusting Y to less than X", when the peak amplitude Y is greater than the threshold value A and the peak amplitude X is not greater than the threshold value A.

6. The method according to claim 2, wherein the dialog box includes options: "Stopping playing the first audio signal and preventing the playing of the second audio signal", "Stopping playing the first audio signal and adjust Y to less than A", "Preventing the playing of the second audio signal and adjust X to less than A", "Adjusting both X and Y to less than A, and X to greater than Y", and "Adjusting both X and Y to less than A, and Y to greater than X", when both the peak amplitude X and the peak amplitude Y are greater than the threshold value A.

7. The method according to claim 1, further comprising:
outputting the second audio signal to the audio playing unit, to directly play the second audio signal as well as the first audio signal, when both the peak amplitude X and the peak amplitude Y are not greater than the threshold value A.

8. The method according to claim 1, further comprising:
notifying a user to determine whether to play the second audio signal through a user interface when the second audio is received; and
outputting the second audio signal to the audio playing unit when the user agrees to play the second audio signal, or preventing the playing the second audio signal if the user disagrees to play the second audio signal.

9. An audio player, comprising:
a display;
an audio playing unit;
a storage;
a processor; and
one or more programs stored in the storage and executed by the processor, the one or more programs comprising:
a signal receiving module that receives a first audio signal, outputs the first audio signal to the audio playing unit, and receives a second audio signal that is inserted to be played later during the playing of the first audio signal;
an extraction module that extracts a peak amplitude X of the first audio signal, and a peak amplitude Y of the second audio signal before the second audio signal is outputted;
a comparison module that compares each of the peak amplitude X and the peak amplitude Y with a predetermined threshold value A;
an adjustment module that adjusts the first audio signal and/or the second audio signal according to the comparison of each of the peak amplitude X and peak amplitude Y with the threshold value A when at least one of the peak amplitude X and the peak amplitude Y is greater than the threshold value A; and
a playing module that outputs the first audio signal and/or the second audio signal to
the audio playing unit according to the adjustment for the first audio signal and/or the second audio signal, and plays the outputted first audio signal and/or the second audio signal through the audio playing unit.

10. The audio player according to claim 9, wherein the adjustment module comprises:
a dialog box sub-module that displays a dialog box on the display of the audio player that includes options indicating manners for adjusting the first audio signal and/or the second audio signal, and notifies a user to select one of the options to adjust the first audio signal and/or the second audio signal, when at least one of the peak amplitude X and the peak amplitude Y is greater than the threshold value A; and
an adjustment sub-module that adjusts the first audio signal and/or the second audio signal according to the option selected by the user.

11. The audio player according to claim 10, wherein the options include one or more manners for adjusting the first audio signal and/or the second audio signal.

12. The audio player according to claim 10, wherein the dialog box includes options: "Stopping playing the first audio signal", "Adjusting X to less than A but greater than Y", and "Adjusting X to less than Y", when the peak amplitude X is greater than the threshold value A and the peak amplitude Y is not greater than the threshold value A.

13. The audio player according to claim 10, wherein the dialog box includes options: "Preventing the playing of the second audio signal", "Adjusting Y to less than A but greater than X", and "Adjusting Y to less than X", when the peak amplitude Y is greater than the threshold value A and the peak amplitude X is not greater than the threshold value A.

14. The audio player according to claim 10, wherein the dialog box includes options: "Stopping playing the first audio signal and preventing the playing of the second audio signal", "Stopping playing the first audio signal and adjust Y to less than A", "Preventing the playing of the second audio signal and adjust X to less than A", "Adjusting both X and Y to less than A, and X to greater than Y", and "Adjusting both X and Y to less than A, and Y to greater than X", when both the peak amplitude X and the peak amplitude Y are greater than the threshold value A.

15. The audio player according to claim 9, wherein the adjustment module further comprises:
an output sub-module that directly outputs the second audio signal to the audio playing unit, to play the second audio signal as well as the first audio signal, when both the peak amplitude X and the peak amplitude Y are not greater than the threshold value A.

16. The audio player according to claim 9, wherein the one or more programs further comprise:
a notification module that displays a selectable input, the selection of which causes the audio player to notify a user to determine whether to play the second audio signal through a user interface when the second audio is received; and
an implementation module that directly outputs the second audio signal to the audio playing unit when the user agrees to play the inserted second audio signal, or preventing the playing of the second audio signal if the user disagrees to play the inserted second audio signal.

* * * * *